United States Patent [19]

Lidow et al.

[11] Patent Number: 4,593,302
[45] Date of Patent: Jun. 3, 1986

[54] PROCESS FOR MANUFACTURE OF HIGH POWER MOSFET WITH LATERALLY DISTRIBUTED HIGH CARRIER DENSITY BENEATH THE GATE OXIDE

[75] Inventors: Alexander Lidow, Manhattan Beach; Thomas Herman, Redondo Beach, both of Calif.

[73] Assignee: International Rectifier Corporation, Los Angeles, Calif.

[21] Appl. No.: 178,689

[22] Filed: Aug. 18, 1980

[51] Int. Cl.$^4$ .......................................... H01L 29/78
[52] U.S. Cl. ................................. 357/23.4; 357/20; 357/41; 357/59
[58] Field of Search .................. 357/23, 41, 59, 20

[56] References Cited

U.S. PATENT DOCUMENTS

| | | | |
|---|---|---|---|
| 4,015,278 | 3/1977 | Fukuta | 357/41 |
| 4,072,975 | 2/1978 | Ishitani | 357/41 |
| 4,145,700 | 3/1979 | Jambutkar | 357/41 |
| 4,148,047 | 4/1979 | Hendrickson | 357/41 |

FOREIGN PATENT DOCUMENTS

| | | | |
|---|---|---|---|
| 53-74385 | 7/1978 | Japan | 357/23 |
| 54-885 | 1/1979 | Japan | 357/23 |

OTHER PUBLICATIONS

H. Collins et al., "New Technology-Hexfet, A New Power Technology, Cuts On-Resistance, Boosts Ratings," Electronic Design, Jun. 7, 1979, 8 pages.
R. Cady et al., "Integ. Tech. for Closed Field-Effect Trans.," IBM Tech. Discl. Bull., vol. 16, #11, Apr. 1974, pp. 3519, 3520.

Primary Examiner—Joseph E. Clawson, Jr.
Attorney, Agent, or Firm—Ostrolenk, Faber, Gerb & Soffen

[57] ABSTRACT

A high power MOSFET structure consists of a plurality of source cells distributed over the upper surface of a semiconductor chip, with a drain electrode on the bottom of the chip. Each of the source cells is hexagonal in configuration and is surrounded by a narrow, hexagonal conduction region disposed beneath a gate oxide. The semiconductor material beneath the gate oxide has a relatively high conductivity, with the carriers being laterally equally distributed in density beneath the gate oxide. The high conductivity hexagonal channel is formed in a low conductivity epitaxially formed region and consists of carriers deposited on the epitaxial region prior to the formation of the source region. Symmetrically arranged gate fingers extend over the upper surface of the device and extend through and along slits in the upper source metallizing and are connected to a polysilicon gate grid which overlies the gate oxide.

14 Claims, 31 Drawing Figures

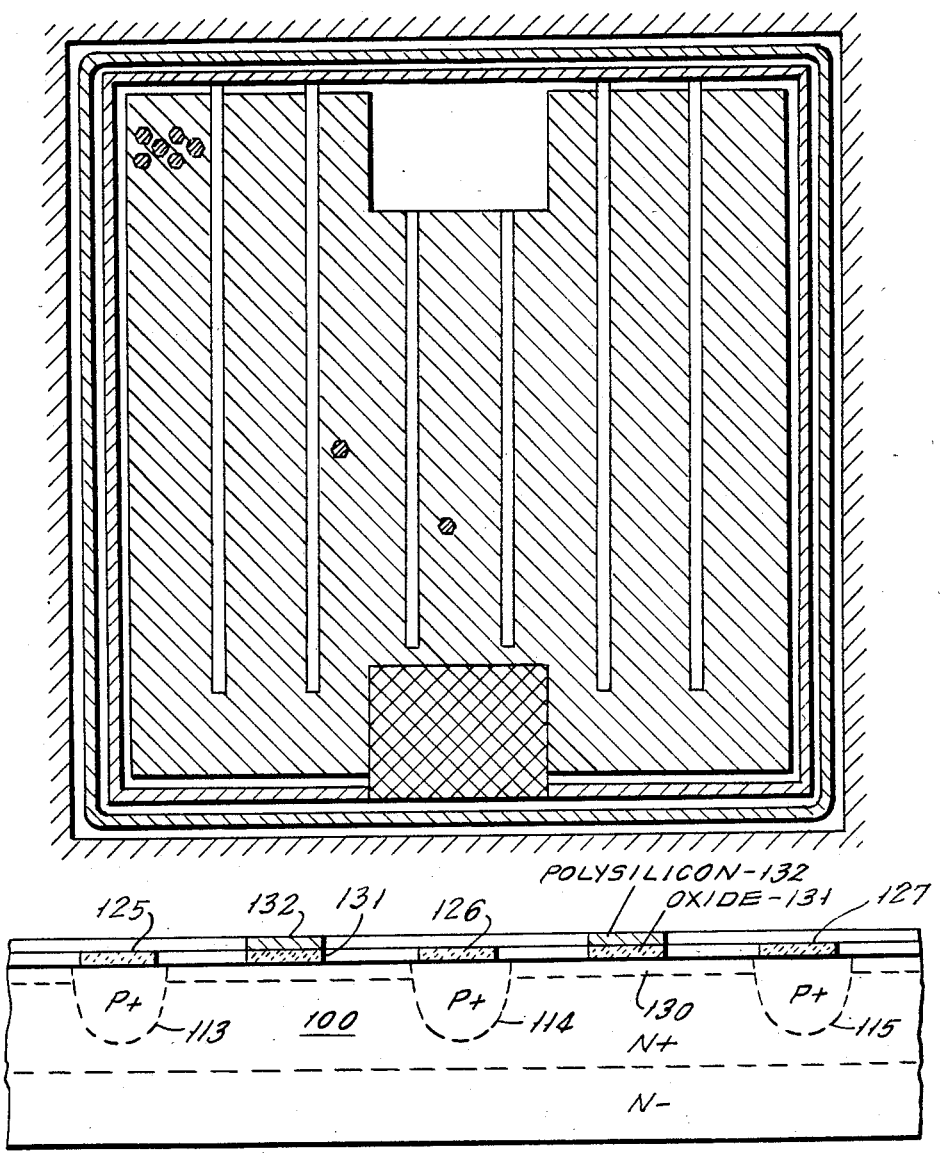
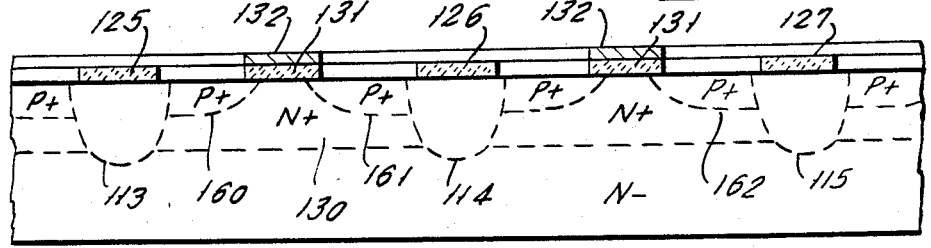

PROCESS FOR MANUFACTURE OF HIGH POWER MOSFET WITH LATERALLY DISTRIBUTED HIGH CARRIER DENSITY BENEATH THE GATE OXIDE

RELATED APPLICATIONS

This application is related to copending application Ser. No. 951,310, filed Oct. 13, 1978, in the names of Alexander Lidow and Thomas Herman, entitled HIGH POWER MOSFET WITH LOW ON-RESISTANCE AND HIGH BREAKDOWN VOLTAGE, now refiled as continuation application Ser. No. 232,713, filed Feb. 9, 1981; and to copending application Ser. No. 38,662, filed May 14, 1979, in the names of Alexander Lidow, Thomas Herman and Vladimir Rumennik, entitled PLURAL POLYGON SOURCE PATTERN FOR MOSFET, now refiled as continuation application Ser. No. 243,544, filed Mar. 13, 1981.

BACKGROUND OF THE INVENTION

This invention relates to MOSFET devices, and more specifically to a novel process and to a novel configuration for the central high conductivity region disposed beneath the gate oxide of a high power MOSFET.

High power MOSFETS having low on-resistance and high breakdown voltage are known and are shown in the above-noted copending application Ser. No. 951,310. In the above application, the source electrodes are interdigitated source regions spaced from one another by two parallel channel regions covered by a common gate. The device has exceptionally low on-resistance and has the usual advantages of a MOSFET device over a bi-polar device. The low on-resistance is obtained by virtue of a relatively highly doped conductivity region disposed beneath the gate oxide and between the two adjacent channels. The highly doped region leads to a common drain electrode. The increased conductivity of the region beneath the oxide in the path leading to the bottom drain does not adversely affect the reverse-voltage characteristics of the device. As a result, it was possible to substantially decrease the forward resistance of the MOSFET without adversely affecting any of its other desirable characteristics.

The interdigitated source structure of application Ser. No. 951,310 has a relatively low packing density, requires relatively complicated masks and has a relatively high capacitance.

The device of copending application Ser. No. 38,662 provides a high power MOSFET device with the low forward resistance of application Ser. No. 951,310 where, however, a very high packing density is available and which can be made with relatively simple masks. The device further has relatively low capacitance. Typically, the device of application Ser. No. 38,662 uses the increased conductivity region beneath the gate oxide and D-MOS fabrication techniques. However, the individual spaced source regions are polygonal in configuration and are preferably hexagonal to ensure a constant spacing along the major lengths of the sources disposed over the surface of the body. An extremely large number of small hexagonal source elements may be formed in the same surface of the semiconductor body for a given device. By way of example, 6,600 hexagonal source regions can be formed in a chip area having a dimension of about 100 by 140 mils to produce an effective channel width of about 22,000 mils, thus permitting very high current capacity for the device. A polysilicon gate is used which has a hexagonal grid-like configuration which is disposed atop an oxide layer. Each leg of the grid overlies two spaced channels which are capable of inversion by application of a voltage to the polysilicon gate. The gate structure is contacted over the upper surface of the device by symmetric, elongated gate contact fingers which ensure good contact over the full surface of the gate.

Each of the polygonal source regions is contacted by a continuous conductive source contact layer which engages the individual polygonal sources through openings in an insulation layer covering the source regions. These openings can be formed by conventional D-MOS photolithographic techniques. A source pad connection region is then provided for the source conductor and a gate pad connection region is provided for the elongated gate fingers and a drain connection region is made to the reverse surface of the semiconductor device.

A plurality of identical chips can be formed on a single semiconductor wafer and the individual elements can be separated from one another by scribing or any other suitable method after processing is completed.

The process used to form the relatively high conductivity region beneath the gate oxide has been such that the conductivity beneath the gate oxide in the region containing the relatively high concentration of impurity carriers is relatively low in laterally central regions and high in the laterally removed side regions. As the result of this non-uniform lateral distribution, the avalanche energy of the device is not optimum. Moreover, the effective lateral resistance beneath the source region and extending from the channel regions to the metal on the surface of the device and circumscribed by the source is higher than optimum. Since this resistance is relatively high, the effective bi-polar transistor formed by three alternate conductivity regions has a high gain and can turn on easily, introducing second breakdown characteristics common to a bi-polar device but normally avoided by a MOSFET device. As the region beneath the source region becomes more depleted, the problem of possible second breakdown increases. Commonly, this shorting or parallel resistance path defining parasitic base resistance cannot be reduced without varying the polysilicon gate width which would increase the on-resistance of the device.

BRIEF DESCRIPTION OF THE INVENTION

In accordance with the invention, a relatively high conductivity implant beneath the gate oxide has a depth of about 1 micron beneath the surface of the oxide but has a conductivity distribution or gradient highest toward the surface of the wafer and increasingly lower as it approaches a depth of approximately 1 micron. Moreover, the lateral distribution of carriers across the width of the region beneath the gate oxide receiving the high doping concentration is constant at any level at and beneath the surface and beneath the gate oxide. By having constant impurity concentration laterally beneath the gate oxide, the device has a higher avalanche energy. Moreover, the use of the novel zero lateral gradient produces a parallel resistance path beneath the source region consisting of parasitic base resistance which is lower than that previously obtained, thereby to reduce second breakdown problems due to the effect of the inherent bi-polar transistor which is formed by the various junctions. Thus, in a prior art N channel device, as the P region beneath the N source region is depleted, the parasitic base resistance would increase. With the novel configuration of zero lateral distribution of impurities beneath the gate oxide, there is less depletion and the parasitic base resistance remains relatively low during operation of the device. Moreover, this reduction in the value of the effective shorting resistor beneath the source is obtained without varying the polysilicon gate width, so that the device maintains a very short polysilicon gate width, for example, 13 to 15 microns.

While the zero lateral gradient distribution beneath the gate oxide of a high density impurity can be formed in many ways, preferably the high density region is implanted prior to the formation of the polygonal source cells and prior to the formation of the gate oxide.

Two implants may be used if desired, one before the gate oxide is formed and the other after the gate polysilicon pattern is formed if it is desired to reduce the Miller capacitance.

BRIEF DESCRIPTION OF THE DRAWINGS

FIG. 11 shows the configuration of the third mask used in accordance with the present invention.

FIG. 16 is a cross-sectional view similar to FIG. 15 after the etching of the polysilicon layer and the underlying oxide layer to expose central hexagonal openings which extend to the surface of the chip.

FIG. 17 shows the section of FIG. 16 after the diffusion and drive of P+ rings into each of the hexagonal openings.

DETAILED DESCRIPTION OF THE DRAWINGS

There is first described the prior art arrangement of application Ser. No. 38,662. The manufacturing process described in copending application Ser. No. 951,310 can be modified to make the device of FIGS. 1 to 5, whereby D-MOS fabrication techniques and ion implantation techniques can be advantageously employed for the formation of the junction and placement of the electrode in the most advantageous way. The device is described as an N channel enhancement type device. It will be apparent that P channel devices and depletion mode devices could also use the features of the structure to be described.

Figure 3:
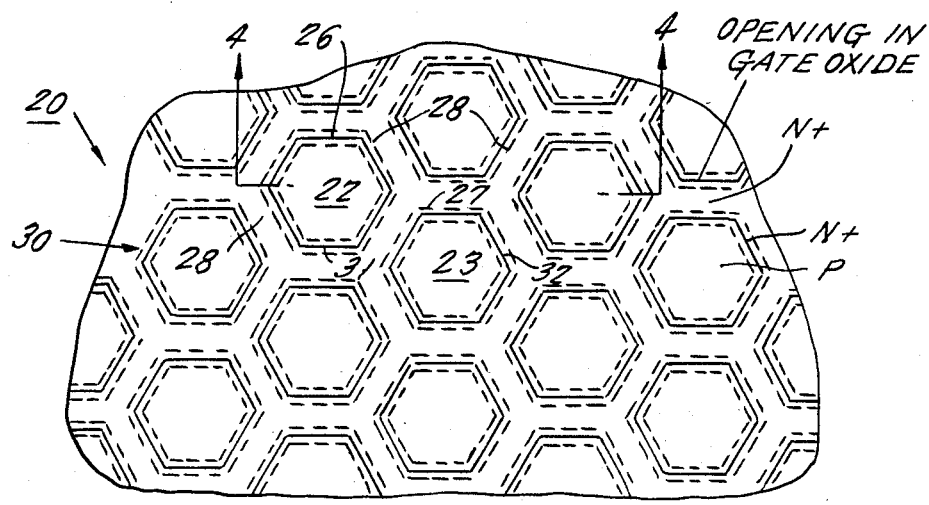
FIG. 3 is a detailed plan view of a small portion of the source region of FIG. 1 during one stage of the manufacturing process of the device.
Figure 4:
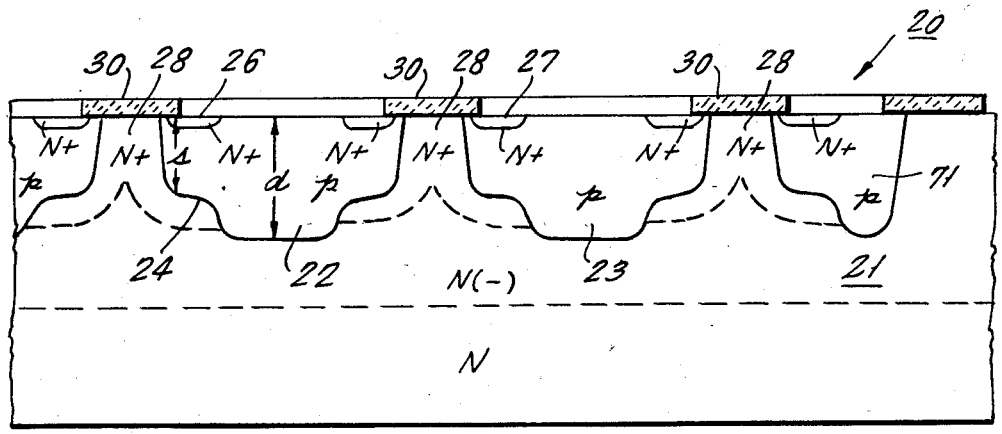
FIG. 4 is a cross-sectional view of FIG. 3 taken across the section line 4—4 in FIG. 3.
Figure 5:
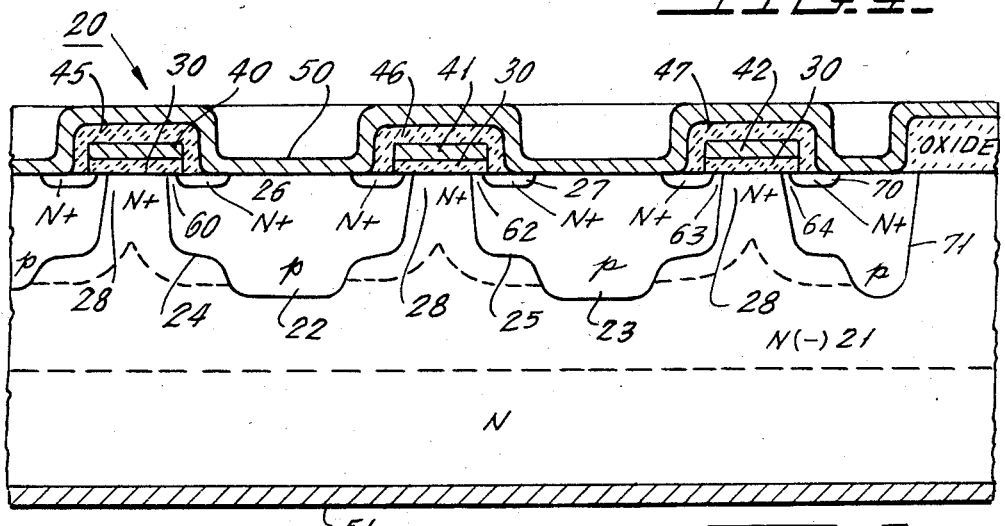
FIG. 5 is similar to FIG. 4 and shows the addition of a polysilicon gate, a source electrode means and drain electrode to the wafer.

The polygon configuration of the source regions is best shown in FIGS. 3, 4 and 5 which are first described. Referring to FIGS. 3 and 4, the device is shown prior to the application of the gate, source and drain electrodes. FIGS. 3 and 4 show a plurality of polygonal source regions on one surface of the device, where these polygonal regions are preferably hexagonal in shape. Other shapes such as squares or rectangles could be used but the hexagonal shape provides better uniformity of spacing between adjacent source region perimeters.

In FIGS. 3 and 4, the hexagonal source regions are formed in a semiconductor body or wafer which is an N type wafer 20 of monocrystalline silicon which has a thin N— epitaxial region 21 deposited thereon as best shown in FIG. 4. All junctions are formed in epitaxial region 21. By using suitable masks, a plurality of P type regions such as regions 22 and 23 in FIGS. 3 and 4 are formed in one surface of the semiconductor wafer region 21, where these regions are generally polygonal in configuration and, preferably, are hexagonal.

A very large number of such polygonal regions are formed. For example, in a device having a surface dimension of 100 by 140 mils, approximately 6,600 polygonal regions are formed to produce a total channel width of about 22,000 mils. Each of the polygonal regions may have a width measured perpendicularly to two opposing sides of the polygon of about 1 mil or less. The regions are spaced from one another by a distance of about 0.6 mil when measured perpendicularly between the adjacent straight sides of adjacent polygonal regions.

The P+ regions 22 and 23 will have a depth d which is preferably about 5 microns to produce a high and reliable field characteristic. Each of the P regions has an outer shelf region shown as shelf regions 24 and 25 for P regions 22 and 23, respectively, having a depth s of about 3.0 microns. This distance should be as small as possible to reduce the capacitance of the device.

Each of the polygon regions including polygonal regions 22 and 23 receive N+ polygonal ring regions 26 and 27, respectively. Shelves 24 and 25 are located beneath regions 26 and 27, respectively. N+ regions 26 and 27 cooperate with a relatively conductive N+ region 28 which is the N+ region disposed between adjacent P type polygons to define the various channels between the source regions and a drain contact which will be later described. The highly conductive N+ regions 28 are formed in the manner described in above-noted copending application Ser. No. 951,310 to produce a very low forward resistance for the device.

In FIGS. 3 and 4, it will be noted that the entire surface of the wafer is covered with an oxide layer or combined conventional oxide and nitride layers which are produced for the formation of the various junctions. This layer is shown as the insulation layer 30. The insulation layer 30 is provided with polygonal shaped openings such as openings 31 and 32 immediately above polygonal regions 22 and 23. Openings 31 and 32 have boundaries overlying the N+ type source rings 26 and 27 for the regions 22 and 23, respectively. The oxide strips 30, which remain after the formation of the polygonal shaped openings, define the gate oxide for the device.

Electrodes may then be applied to the device as shown in FIG. 5. These include a polysilicon grid which includes polysilicon sections 40, 41 and 42 which overlie the oxide sections 30.

A silicon dioxide coating is then deposited atop the polysilicon grid 40 shown as coating sections 45, 46 and 47 in FIG. 5 which insulates the polysilicon control electrode and the source electrode which is subsequently deposited over the entire upper surface of the wafer. In FIG. 5 the source electrode is shown as conductive coating 50 which may be of any desired material, such as aluminum. A drain electrode 51 is also applied to the device.

The resulting device of FIG. 5 is an N channel type device wherein channel regions are formed between each of the individual sources and the body of the semiconductor material which ultimately leads to the drain electrode 51. Thus, a channel region 60 is formed between the source ring 26, which is connected to source electrode 50, and the N+ region 28 which ultimately leads to the drain electrode 51. Channel 60 is inverted to the N type conductivity upon the application of a suitable control voltage to the gate 40. In a similar manner, channels 61 and 62 are formed between the source region 26, which is connected to the conductor 50, and the surrounding N+ region 28 which leads to the drain 51. Thus, upon application of a suitable control voltage to the polysilicon gate (including finger 41 in FIG. 5), channels 61 and 62 become conductive to permit majority carrier conduction from the source electrode 50 to the drain 51.

Each of the sources form parallel conduction paths where, for example, channels 63 and 64 beneath gate element 42 permit conduction from the source ring 27 and an N type source strip 70 to the N+ region 28 and then to the drain electrode 51.

It is to be noted that FIGS. 4 and 5 illustrate an end P type region 71 which encloses the edge of the wafer.

The contact 50 of FIG. 5 is preferably an aluminum contact. It will be noted that the contact region for the contact 55 lies entirely over and in alignment with the deeper portion of the P type region 22. This is done to prevent the aluminum used for the electrode 50 from spiking through very thin regions of the P type material. This permits the active channel regions defined by the annular shelves 24 and 25 to be as thin as desired to reduce device capacitance.

Figure 1:
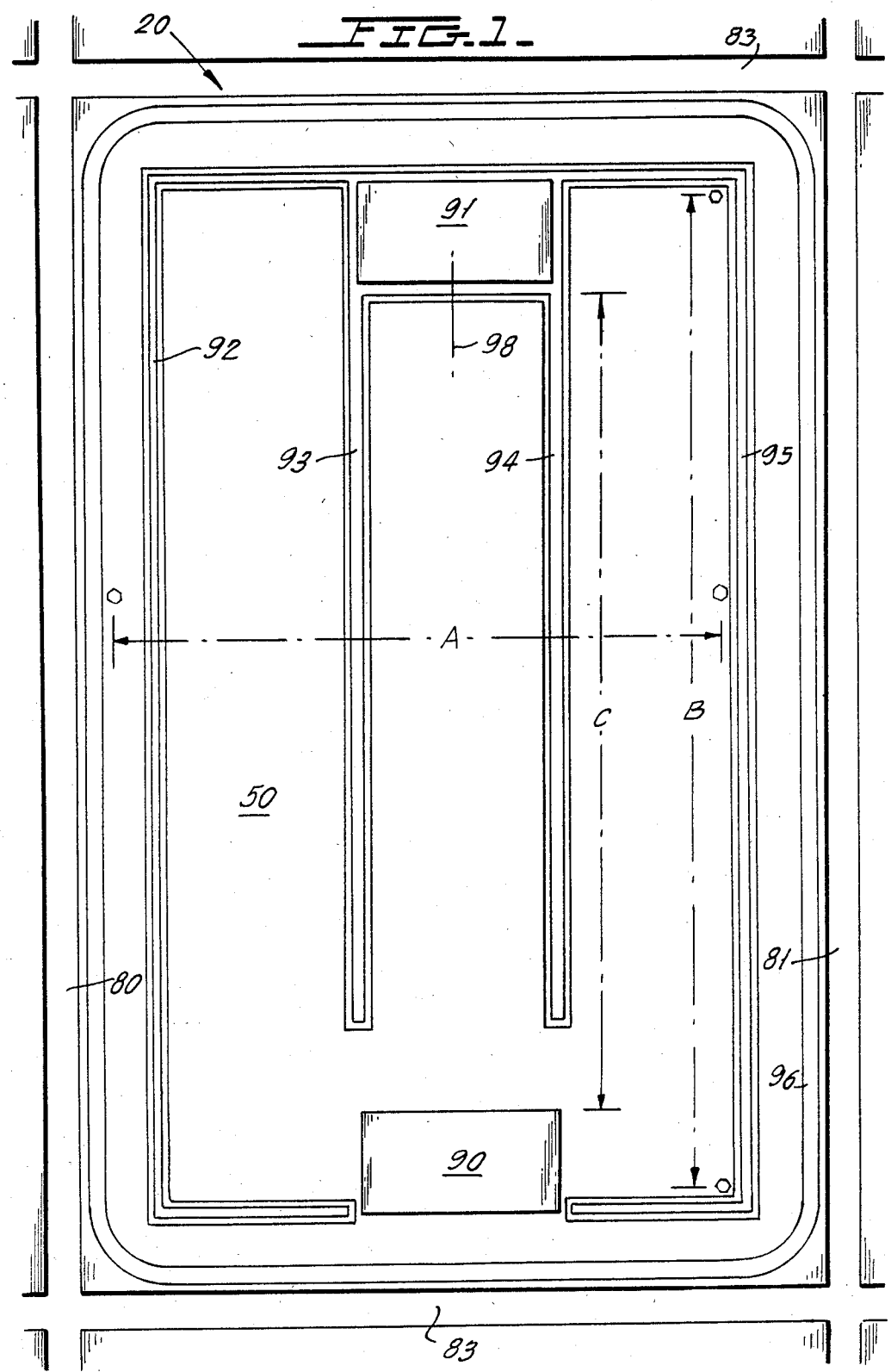
FIG. 1 is a plan view of a completed element on a semiconductor wafer prior to the separation of the element away from the remainder of the wafer, as described in copending application Ser. No. 38,662.

FIG. 1 illustrates one completed device using the polygonal source pattern of FIG. 5. The completed device shown in FIG. 1 is contained within the scribe regions 80, 81, 82 and 83 which enable the breaking out of a plurality of unitary devices each having a dimension of 100 by 140 mils from the body of the wafer.

The polygonal regions described are contained in a plurality of columns and rows. By way of example, the dimension A contains 65 columns of polygonal regions and may be about 83 mils. The dimension B may contain 100 rows of polygonal regions and may be about 148 mils. Dimension C, which is disposed between a source connection pad 90 and a gate connection pad 91, may contain 82 rows of polygonal elements.

The source pad 90 is a relatively heavy metal section which is directly connected to the aluminum source electrode 50 and permits convenient lead connection for the source.

The gate connection pad 91 is electrically connected to a plurality of extending fingers 92, 93, 94 and 95 which extend symmetrically over the outer surface of the area containing the polygonal regions and make electrical connection to the polysilicon gate as will be described in connection with FIG. 2.

Finally the outer circumference of the device contains a P+ deep diffusion ring which may be connected to field plate 96 shown in FIG. 1.

Figure 2:
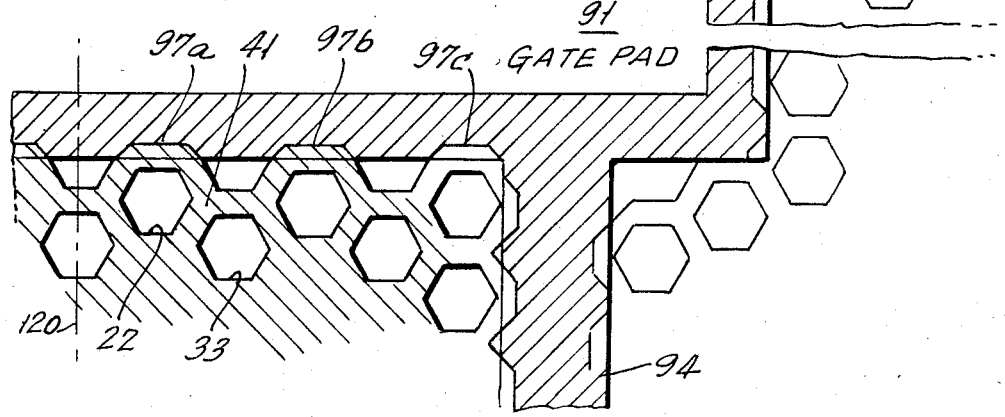
FIG. 2 is an enlarged detail of the gate pad of FIG. 1 to illustrate the relationship of the gate contact and the source polygons in the region of the gate pad.

FIG. 2 shows a portion of the gate pad 91 and the gate fingers 94 and 95. It is desirable to make a plurality of contacts to the polysilicon gate to reduce the R-C delay constant of the device. The polysilicon gate has a plurality of regions including regions 97a, 97b, 97c (FIG. 2) and the like which extend outwardly and receive extensions of the gate pad and the gate pad elements 94 and 95. The polysilicon gate regions may be left exposed during the formation of the oxide coating 45-46-47 in FIG. 5 and are not coated by the source electrode 50. Note that in FIG. 2 the axis 98 is the axis of symmetry 98 which is that shown in FIG. 1.

The MOSFET shown and described in FIGS. 1 to 5 has operated very well. The device, however, has had limited avalanche energy and minor second breakdown problems. These problems are believed due to the variable density of the increased doping concentration region beneath the gate oxide and between two channels in a lateral direction. Thus, as shown in FIG. 5, the concentration of impurities in a lateral direction beneath the surface of oxide 30 will vary in the manner shown in FIG. 6 which shows donor and acceptor concentration at the silicon surface as a function of the lateral distance along the gate oxide in FIG. 5.

Figure 6:
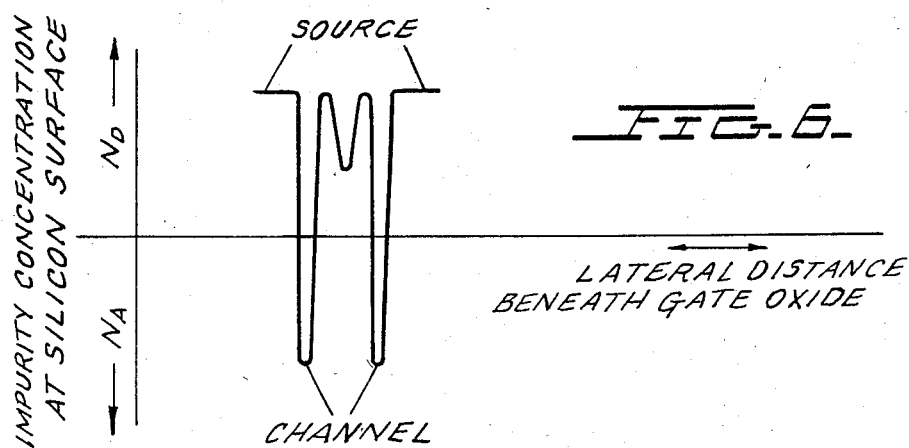
FIG. 6 schematically illustrates the concentration of impurities in the lateral dimension beneath the gate oxide in the prior art device of FIG. 5.

The concentration of the sources 26 and 27 is shown in the left and right, respectively, in FIG. 6, but it will be seen that at the center of region 28 beneath the oxide the concentration of the N+ doping impurity atoms reduces.

As a result of this variable doping concentration in the lateral direction, there will be greater depletion beneath the P+ regions 22 and 23 during operation. With this depletion, the effective resistance $r_b'$ of the bi-polar transistor comprised of regions 26, 22 and 21 is relatively high so that the transistor has high gain and can turn on easily. This turn-on causes a hot spot on the device and can destroy the device. This second breakdown problem is associated with bi-polar devices but avoided by the MOSFET. Note that, as the P+ regions 22 and 23 of each of the cells of the device become more depleted, the second breakdown problems increase.

Another problem created by the nonlinear distribution of carriers across the relatively high conductivity region beneath the gates 30 is that the avalanche energy of the device is somewhat reduced so that the device is not as resistant as possible to destruction due to high voltage spikes.

As will be seen more fully hereinafter, the novel device of the invention and the process for production of the device provides a constant carrier density in a lateral direction beneath the gate 30 and between the source regions leading into the gates. This carrier density is relatively high immediately beneath the gate and gradually decreases with the distance beneath the device surface. As a result of this novel redistribution of carriers beneath the gate oxide, there is very little depletion of the P+ regions 22 and 23 during operation of the device so that the bypass resistance $r_b'$ beneath the source regions remains low and the bi-polar transistor inherently formed in the device has low gain so that second breakdown problems are avoided. Moreover, the novel grading of the density of carriers in the region beneath the gate, such that there is a higher concentration immediately beneath the gate with a gradually decreasing concentration farther from the gate, establishes a higher avalanche energy for the device so it is more resistant to damage due to overvoltage spikes.

As will be later seen, a relatively minor modification is all that is needed in the process of manufacture of the device to obtain these advantages. This difference is the use of an N type implant and drive before the formation of the gate oxide in an N channel device embodiment. Note that in the embodiment of FIGS. 1 to 5 and using the process disclosed in copending application Ser. No. 951,310, the N+ regions 28 are formed after the gate oxide is deposited on the device. This process leads to the nonlinear concentration of carriers along the surface of the device as depicted in FIGS. 5 and 6.

MANUFACTURING PROCESS IN ACCORDANCE WITH THE INVENTION

In carrying out the present invention, the following description is for the production of a single device on a single chip portion, such as the chip shown in FIG. 1 with slightly different surface geometry. Moreover, the description is for an N— channel depletion device. It will be obvious to those skilled in the art that the invention can also be adapted for P channel devices and for both depletion and enhancement mode devices.

In manufacturing the device of the invention, the first step in the process is the deposition of a field oxide on the surface of a single wafer containing a plurality of identical chips. Note that a large number of identical wafers can be simultaneously processed. Each wafer may be of the type partly shown in FIG. 8 and consists of an N+ body having an N— epitaxially deposited region 100. Typically the wafer of FIG. 8 can have an N+ substrate which is about 14 mils thick, with an N— epitaxial layer having a thickness and resistivity depending upon desired reverse voltage. Typically, the epitaxial layer 100 may be about 35 microns thick and have a resistivity of about 20 ohm centimeters for the embodiment described.

A field oxide 101 is deposited on the surface of the N— layer 100 in accordance with standard well-known techniques. Thereafter, a suitable photoresist is placed upon the upper surface of the oxide 101 and the surface is exposed to ultraviolet light through a mask having a pattern such as that shown in FIG. 7 for each chip element. Clearly, a conventional glass mask will contain a large number of patterns identical to that of FIG. 7.

Figure 7:
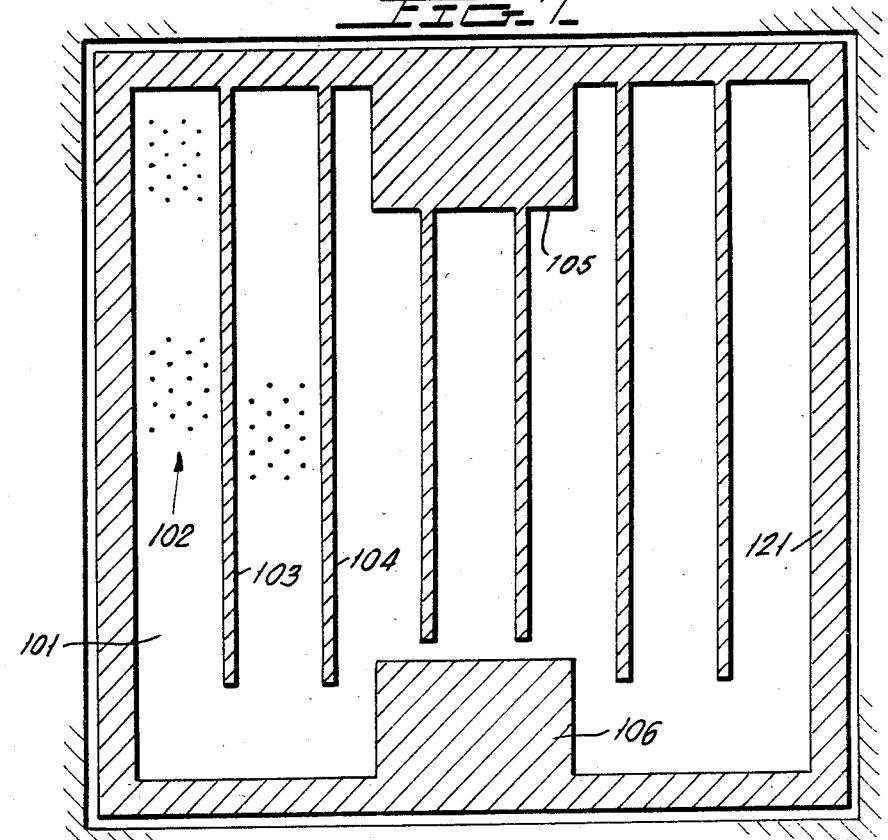
FIG. 7 shows the first mask pattern for processing a chip in accordance with the present invention.

The photoresist pattern produced includes a large plurality of small diameter circular openings, produced by the dot areas 102, which are deposited over the full unshaded area of the mask in FIG. 7. The dots are arranged in columns staggered from one another to align the dots of adjacent columns. Within each vertical area between gate finger regions, such as regions 103 and 104, there can be about 24 columns of dots. Each column could contain, for example, 150 dots. Note that each of the dots will correspond to the center of a respective hexagonal cell which is to be formed in the single chip element. Note also that the elongated finger areas 103 and 104 lead to a gate pad region 105. The region 106 corresponds in location to a source pad connection region as will be later described.

Figure 8:
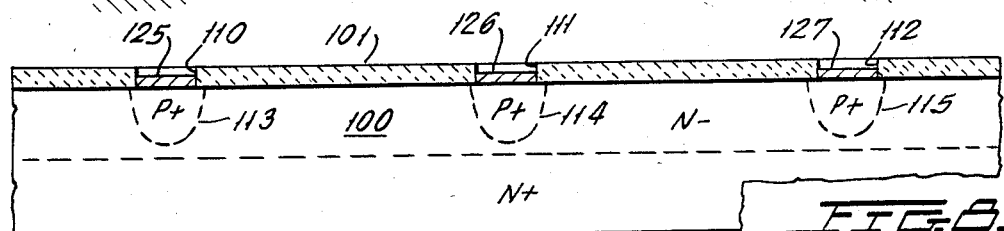
FIG. 8 shows a central region of the chip after diffusion through small diameter windows etched in the field oxide when using the mask of FIG. 7.

The oxide exposed through the photoresist pattern formed with the mask of FIG. 7 is etched with a suitable etching solution to produce openings, such as typical openings 110, 111 and 112 shown in FIG. 8 in the oxide 101. These openings correspond to locations of three of the mask dots 102 in FIG. 7, and are shown in FIG. 8 in greatly enlarged but unscaled fashion.

After the etching operation, the photoresist mask is stripped off and the wafer is placed in ion implantation apparatus for implanting boron atoms into areas not covered by the oxide layer 101. Thus, P type conductivity boron atoms are implanted through the openings 110, 111 and 112. Typically, the boron atoms can have a dose of $5 \times 10^{13}$ to $1 \times 10^{15}$ atoms/cm$^2$ and can be implanted with accelerating voltages greater than about 5 kV.

Figure 12A:
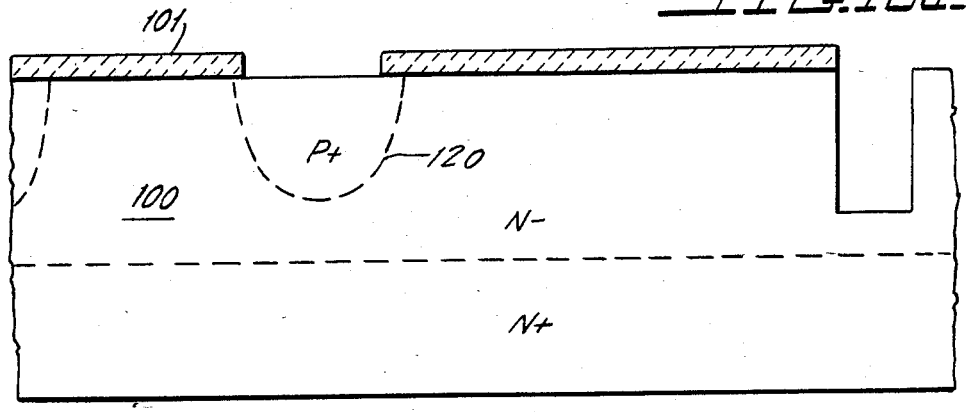
FIGS. 12a to 12e show the configuration of the peripheral boundary of the chip at different stages of the processing of the chip in accordance with the invention.
Figure 13A:
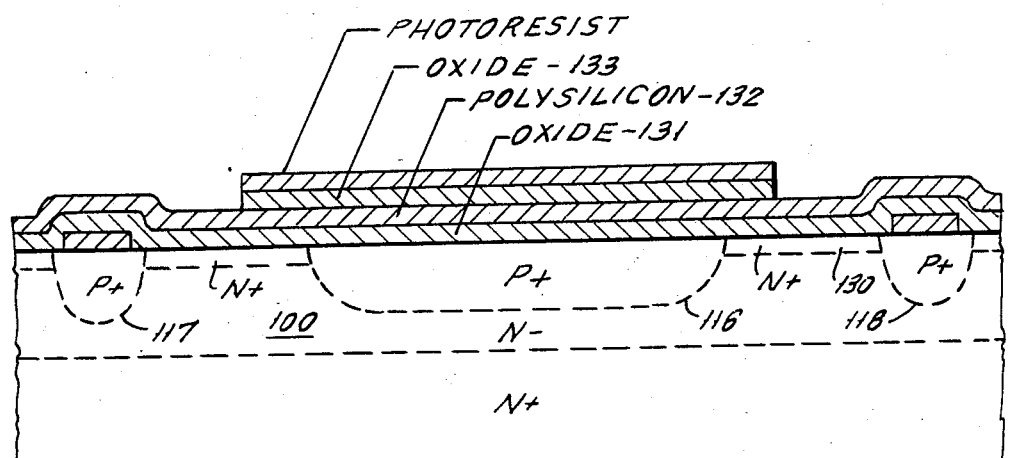
FIGS. 13a to 13f illustrate various steps in the processing of a typical elongated gate finger during the processing of the chip of the invention.

This boron implant is followed by a heating drive to drive the boron impurity atoms deeper into the surface of the wafer to form the P+ regions 113, 114 and 115 through the openings 110, 111 and 112, respectively. At the same time, a relatively broad area elongated P+ region 116 underlying, for example, the finger region 104 in the mask of FIG. 7 is formed as shown in FIG. 13a. Note that in FIG. 13a the finger 116 is disposed immediately between P+ regions 117 and 118 which are in columns of dots on opposite sides, respectively, of the finger 104. Similarly, an elongated P+ channel guard ring 120 is formed around the periphery of the chip following mask region 121 in the mask of FIG. 7 as shown in FIG. 12a.

During the boron implant and drive operation, a small oxide layer grows over the oxide surface exposed through windows 110, 111 and 112, shown as the oxide layers 125 to 127 in FIG. 8. These oxide layers are left in place to serve as a portion of a diffusion window in a subsequent operation to be described in connection with the implantation of the source region.

A second photolithographic mask is next provided to remove all of the oxide from the surface of region 100 except those oxide patterns covering the P+ regions which have been diffused with the use of the mask of FIG. 7. This mask will have the general appearance of the mask of FIG. 7 but will have a reversed field.

Figure 9:
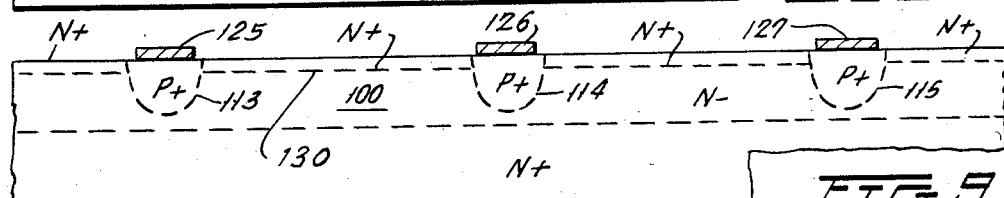
FIG. 9 shows the chip section of FIG. 8 after the application of a second mask used to remove the remainder of the field oxide but retaining small oxide pads over the P+ diffusion and shows an N+ implant over the full exposed surface of the wafer.

After the formation of the photolithographic mask pattern over all but the diffused P+ regions, an oxide etch takes place to produce the pattern shown in FIG. 9 for the dot regions. Note that each of the oxide regions 125, 126 and 127 should have a diameter greater than about 6 microns after the oxide etch and the removal of the photoresist from the top surface of the oxide elements 125, 126 and 127.

Thereafter, the wafer is cleaned and prepared for a phosphorus implant during which a beam of phosphorus atoms is applied to the surface of the chip area at a voltage of about 120 kV with an implantation dose of from $1 \times 10^{11}$ to $1 \times 10^{14}$ phosphorus atoms/cm$^2$. This implantation produces the thin surface coating, shown in FIG. 9 as the N+ region 130, in all regions not coated by the oxide dots or other oxide patterns above the P+ regions formed in the step of FIG. 8 and defined by the mask of FIG. 7. The N+ region 130 also is produced in the regions shown in FIG. 13a at the gate contact finger regions. The N+ implant 130 permits the formation of the novel high conductivity region beneath subsequently formed gate oxide, which high conductivity region has a constant lateral density and a gradient from relatively high concentration to relatively low concentration beginning from the chip surface beneath the gate oxide and extending down into the body of the chip.

Following the N+ implant 130, the wafer is placed in an oxidation tube and an oxide layer 131 is grown atop the upper surface of the wafer. Thereafter, a polysilicon layer 132 is grown atop the oxide layer 131. The polysilicon layer 132 typically could have a thickness of about 5,000 Angstroms and will constitute the gate electrode of the completed device, after further processing, as will be later described.

Figure 10:
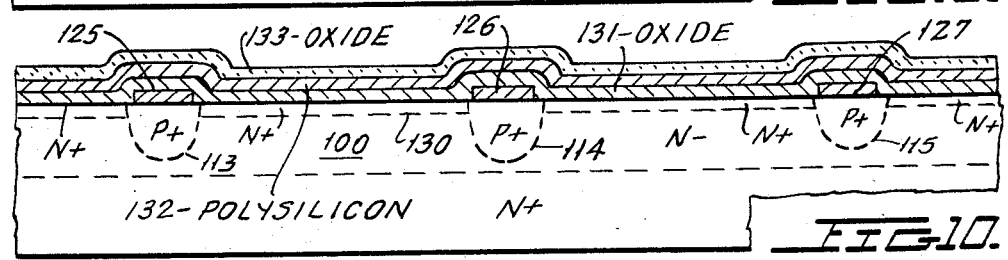
FIG. 10 shows the chip section of FIG. 9 after the application of an oxide layer, a polysilicon layer and a second oxide layer.
Figure 15:
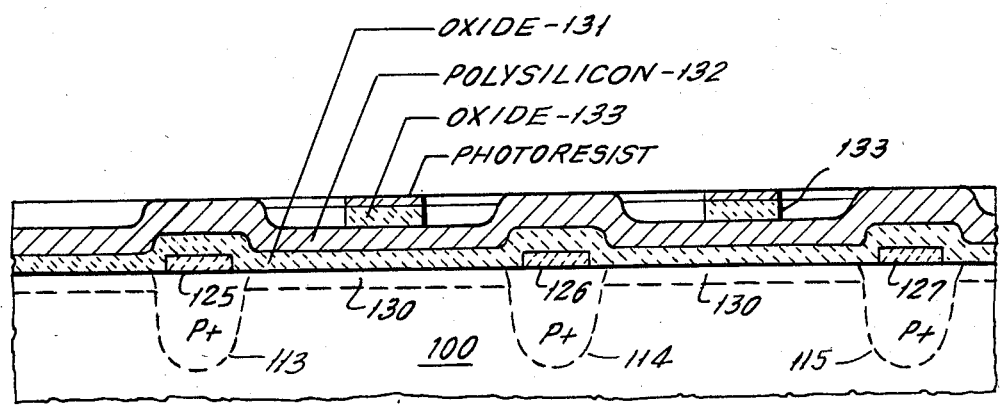
FIG. 15 is a cross-sectional view of FIG. 14 taken across the section lines 15—15 in FIG. 14.

The polysilicon layer 132 is next covered with a second oxide layer 133. Thereafter a third mask is applied to the surface of the device of FIG. 10 and a photoresist is exposed through the mask pattern shown in FIG. 11. In FIG. 11, the opaque portions of the photoresist mask are shown in dark or cross-hatched lines. The surface of the device of FIG. 10 is shown in FIG. 15 after etching through the mask formed with the pattern of FIG. 11. The mask of FIG. 11 has, in the large shaded areas between the gate contact fingers, a pattern of polygonal sections centered on each of dots 102 of the mask of FIG. 7. Each of these sections will, as will later be seen, define respective polygonal cells which are connected in parallel between the top and bottom surfaces of the chip.

After the photoresist pattern, using the mask pattern of FIG. 11, is formed on the surface of oxide layer 133, an oxide etch takes place to etch polygonal openings in oxide layer 133. This etch leaves a hexagonal grid remaining in the surface of layer 133 and beneath the corresponding photoresist grid.

Figure 14:
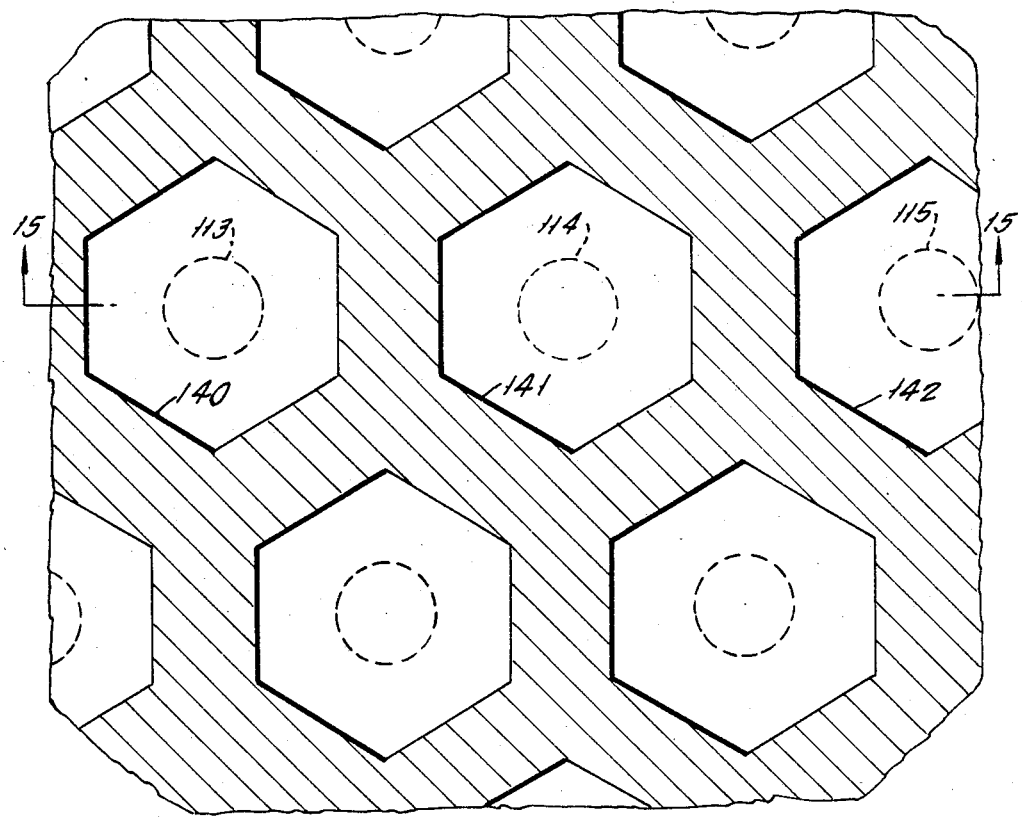
FIG. 14 is a top view of the wafer section of FIG. 10 after processing with the mask of FIG. 11 to remove polygonal-shaped sections from the upper oxide coating in the section of FIG. 10.

Note that the typical polygonal openings 140, 141 and 142 in the oxide layer 133 are centered over the P+ dot regions 113, 114 and 115, respectively, in FIG. 14 which is a plan view of a small portion of the polygonal cell region of FIGS. 11 and 15.

The oxide grid 133 which remains in FIGS. 14 and 15 will then serve as a mask for a subsequent polysilicon etch. An etch is then carried out to etch polygonal openings in the polysilicon layer 132. Subsequently using the polysilicon as a mask, the oxide layer 131 has hexagonal openings etched therein by an oxide etch as shown in FIG. 16. After these etching operations, a polygonal network remains on the surface of the N− epitaxial layer 100 formed of a lower oxide layer 131 and an upper polysilicon layer 132 which defines the gate for the devices which are subsequently formed in the remaining steps of the process.

Figure 13B:
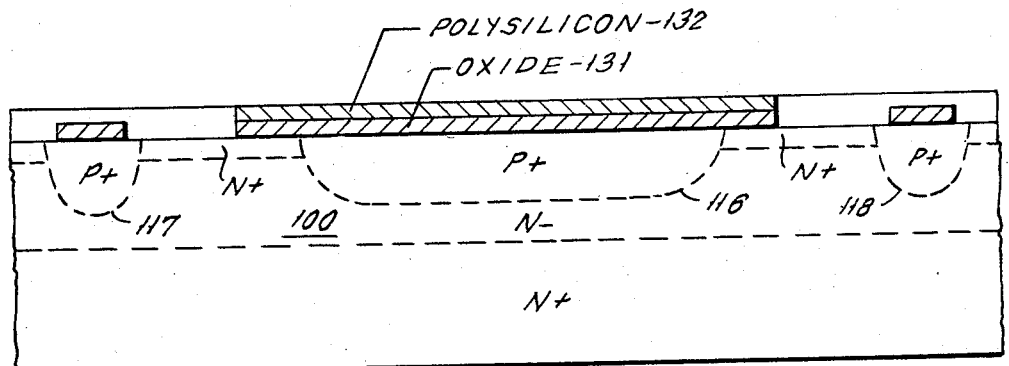

While the hexagonal grid defining the polysilicon gate 132 and its underlying oxide layer 131 are formed in FIGS. 14, 15 and 16, the same oxide etch and polysilicon etch will produce the pattern for the extending gate contact fingers, such as finger 104, as is shown in FIG. 7. Thus, in FIG. 13b, polysilicon layer 132 overlying oxide layer 131 extends along the surface of the chip, with the outer edges of the strip 131-132 serving the purpose of a cell edge which cooperates with the cell to be formed about the P+ regions 117 and 118, respectively. The same is true of all other cells in the columns of cells containing cells 117 and 118, respectively.

Figure 12B:
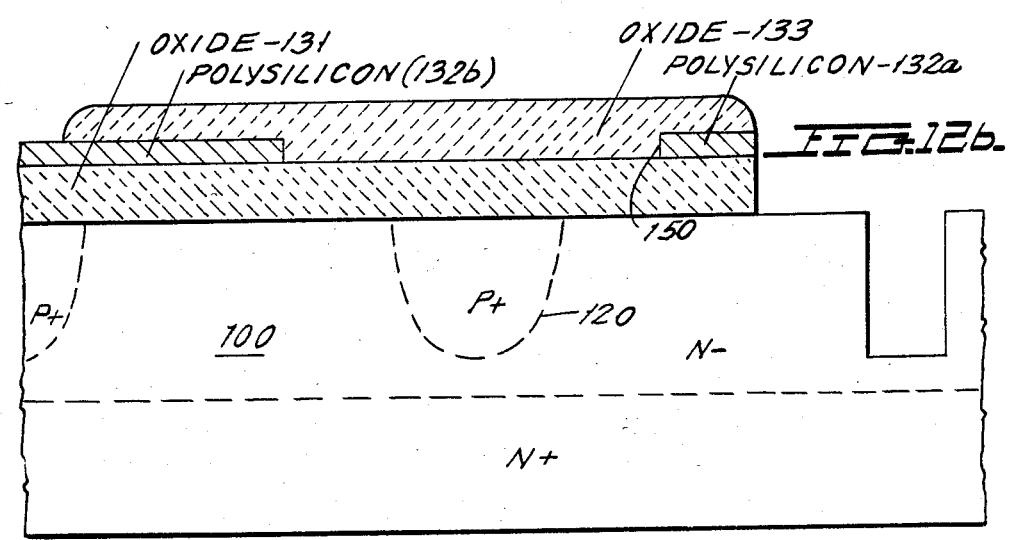

The polysilicon layer 132 and oxide layer 133 encircle the periphery of the device as shown in FIG. 12b. Note that the polysilicon layer is severed at the periphery of the device and at region 150 through appropriate masking and etching steps during the etching of the polysilicon layer 132 of FIGS. 14 and 15 to form the hexagonal grid pattern, and outer rings 132a and 132b are formed.

Following the etching of the oxide layer 131 and polysilicon layer 132 by the process just described, the wafers are placed in an implanting apparatus. A boron implant is then applied to the wafer surface to implant P type conductivity carriers in the windows formed in the oxide and polysilicon coatings on the surface of the wafer which define a mask to the implanting boron beam.

The boron beam may have a voltage of about 50 kV and applies a dose of from $5 \times 10^{13}$ to $5 \times 10^{14}$ atoms/cm$^2$. This implant is followed by a diffusion drive which can vary from 30 minutes to 120 minutes at a temperature in the range of 1150° C. to 1250° C. This operation then forms P+ annular rings 160, 161 and 162 shown in FIG. 17 surrounding the individual P+ dot regions 113, 114 and 115, respectively. The N+ region 130 is also driven deeper beneath the wafer surface, as shown in FIG. 17, during the diffusion drive for driving the P+ regions 160, 161 and 162.

Following this drive, the exterior surface of the wafer is deglassed as by use of hydrofluoric acid and the wafer is then again placed in a furnace and exposed to POCl$_3$ in an appropriate carrier gas for from 10 minutes to 50 minutes at a temperature of from 850° C. to 1000° C. This step forms the N+ source rings, such as the N+ rings 170 and 171 which surround P regions 113 and 114 in FIG. 18. Respective source rings, such as rings 170 and 171, enclose each of the thousands of cells formed on the surface of the chip and have outer hexagonal peripheries which have constant spacing of from 13 to 15 micons between adjacent hexagonal elements.

Figure 18:
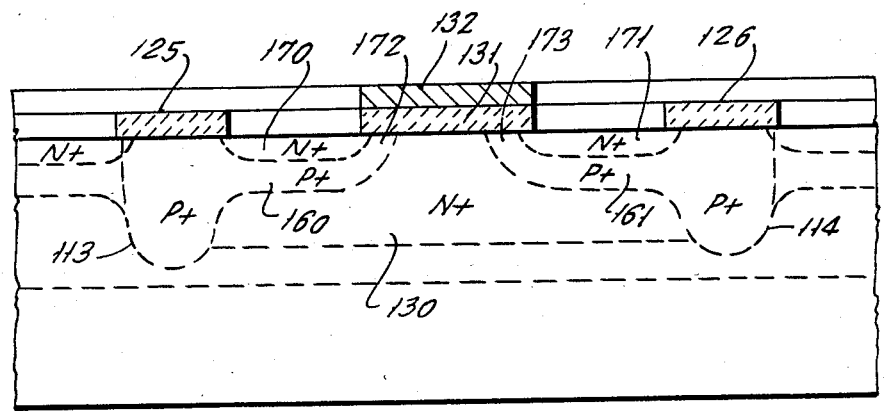
FIG. 18 shows the section of FIG. 17 after the implanting of source rings into the P+ rings or cells of FIG. 17 using self-aligned diffusion techniques to form a plurality of hexagonal channels which can be inverted by a gate voltage.

The source rings 170 and 171 define, within the P+ regions 160 and 161, respectively, hexagonal channels such as channels 172 and 173 in FIG. 18 which lead to the common N+ region 130 beneath the gate oxide 131.

Figure 19:
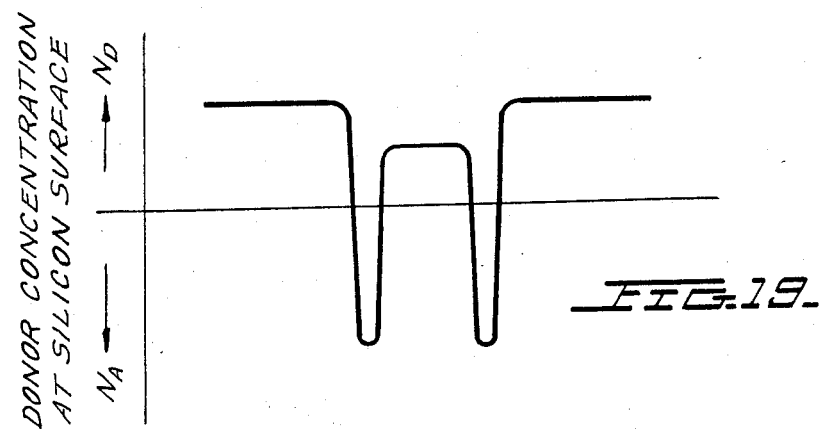
FIG. 19 shows the doping concentration beneath the gate oxide in accordance with the present invention.

As a consequence of the process, the distribution of donors and acceptors in the N30 region 130, beneath the gate oxide 131, is that shown in FIG. 19. By comparing FIGS. 19 and 6, it will be apparent that the distribution of donors at the surface of the wafer is constant rather than varied as shown in FIG. 6. Moreover, the density of donors at the upper portion of the wafer is greater than that in the lower region, thereby to cause the beneficial results of reducing depletion in the regions 160 and 161 during operation of the device, to reduce the resistance beneath the source regions 170 and 171. This, in turn, reduces the affect of the bi-polar transistor defined unintentionally by the various junctions and avoids second breakdown problems in connection with that transistor. The structure also increases the avalanche energy of the device.

Figure 13C:
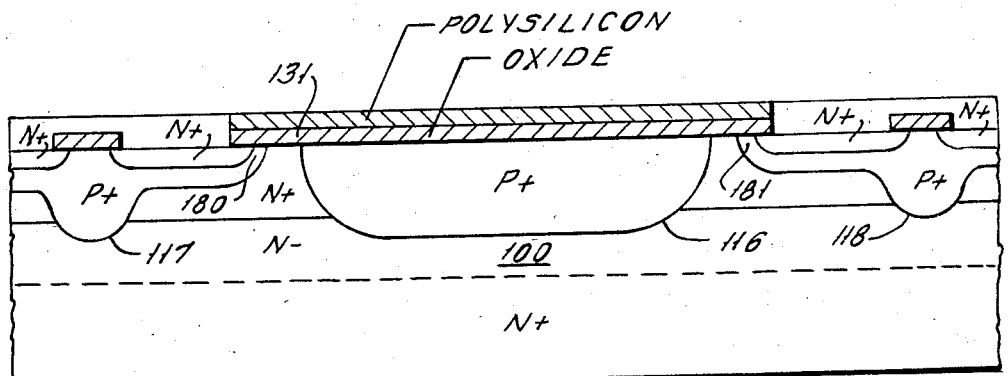

As shown in FIG. 13c, hexagonal P+ regions 117 and 118 are also formed during the P+ and N+ implantation steps described in connection with FIGS. 17 and 18. The edge of the cells of each of the columns containing regions 117 and 118 define channel sections 180 and 181 disposed beneath the opposite sides of the oxide stripes 131 of the gate finger.

Following the formation of the source regions in the steps of FIGS. 17 and 18, such as source regions 170 and 171, the device is again deglassed as by etching in hydrofluoric acid.

Figure 13D:
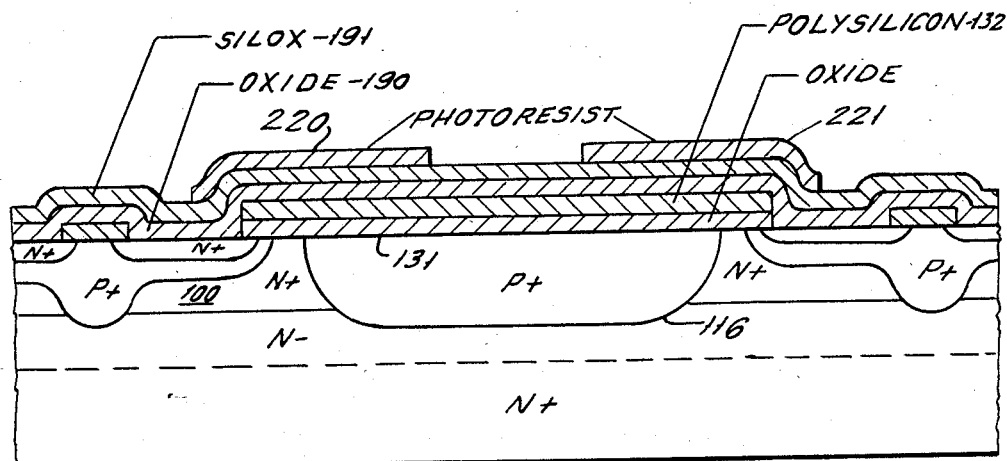
Figure 20:
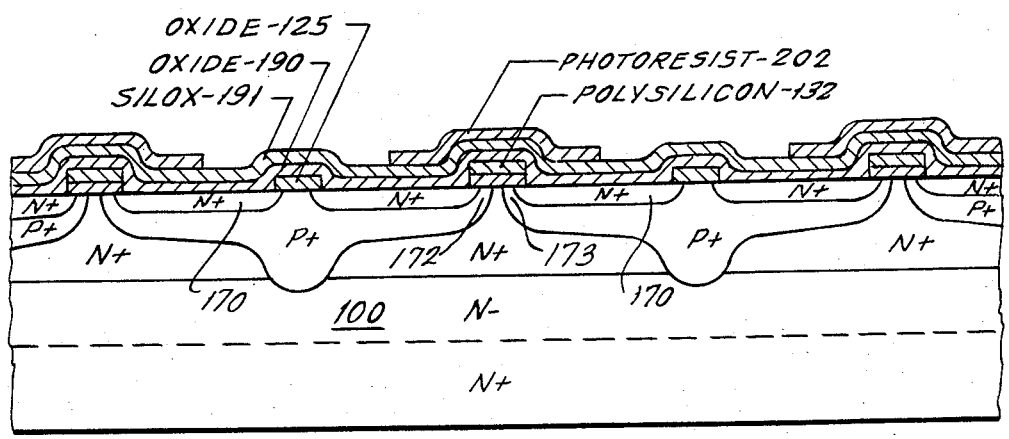
FIG. 20 shows the wafer of FIG. 18 after the formation of an oxide layer, a silox layer and a photoresist pattern which is formed using the mask of FIG. 21.

After deglassing, the wafer is again placed in an oxidation tube and, as shown in FIG. 20, an oxide layer 190 is grown over the entire outer surface of the device. Thereafter, a silox layer 191 is deposited over the oxide surface. The wafer is then placed in a reflow tube to reflow the silox. Silox is well known and is a phosphorus-doped silicon oxide which can reflow to form a continuous glassy coating following the contours of the surface on which it is received. Preferably, the silox layer 191 contains 7% to 10% by weight of phosphorus. Note that the oxide layer 190 and silox layer 191 are also deposited over the elongated gate finger region as shown in FIG. 13d, and over the outer periphery of the device of FIG. 12b (not shown).

Figure 21:
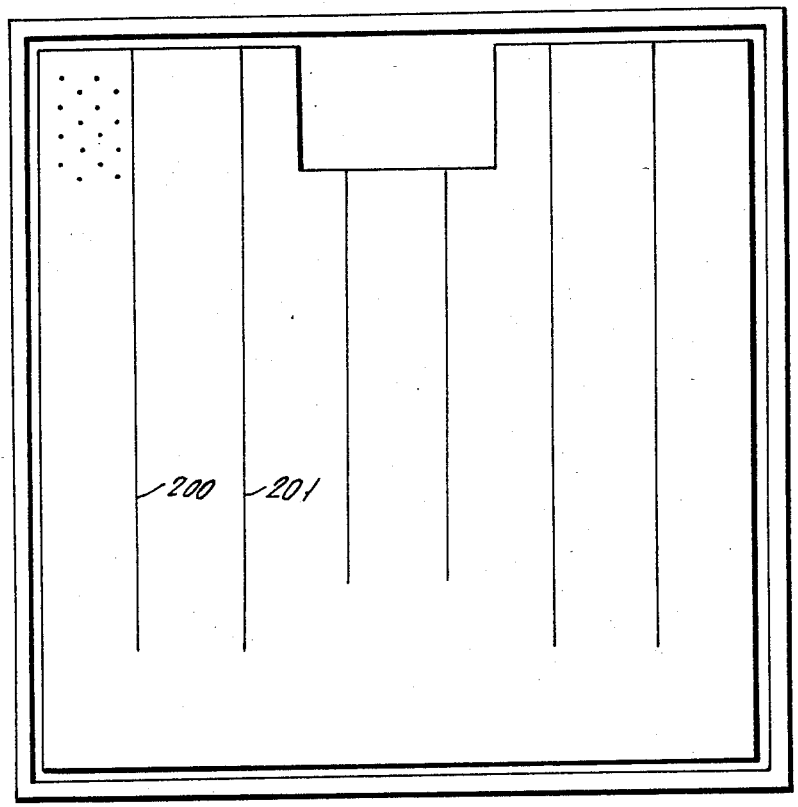
FIG. 21 shows a mask pattern constituting the fourth mask of the process of making the novel device of the invention.

Thereafter, and as shown in FIG. 21, a fourth mask is applied to the upper surface of the wafer and a photoresist pattern is formed on the upper surface of the wafer corresponding to the configuration of the mask of FIG. 21, where the dark areas of the mask of FIG. 21 represent unpolymerized areas of the photoresist. The dot pattern in the mask of FIG. 21 forms openings aligned with the initial P+ implant regions such as regions 113, 114 and 115, while the lines, such as lines 200 and 201 for the gate finger regions, overlie the center of the gate finger patterns of the mask of FIG. 7.

After the formation of the photoresist mask, shown as the photoresist mask 202 in FIG. 20, central areas of each of the polygonal cells are exposed and an oxide etch is carried out to etch away the exposed silox 191, the exposed oxide 190 and the oxide 125 and expose the upper surface of expitaxial region 100 at the center of each of the polygonal cells.

Figure 22:
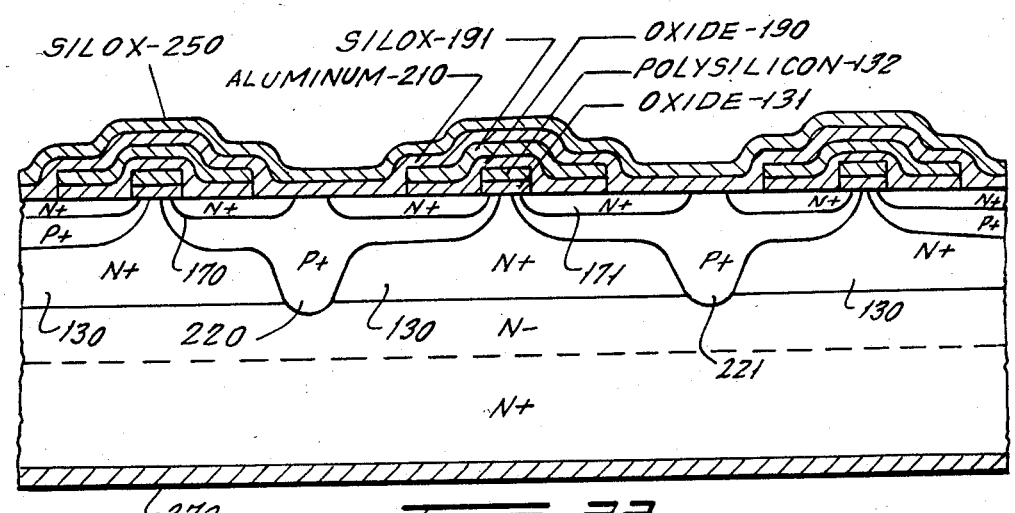
FIG. 22 shows the chip section of FIG. 20 after etching away the central oxide and silox areas covering each of the hexagonal cells and after the deposition of an aluminum sheet over the entire top surface of the device to define the source electrode.

The wafer is thereafter cleaned and aluminum is evaporated onto the entire upper exposed surface of the wafer as shown by the aluminum layer 210 in FIG. 22.

In FIG. 22, all of the P+ regions are merged to define P+ cells 220 and 221 which contain ring-shaped source elements 170 and 171. N+ regions 130 have a depth, for example, of greater than about 1 micron below the upper surface. Note that each of the P+ regions has the desired shelf configuration beneath the N+ rings as was previously described in FIG. 5.

Figure 13E:
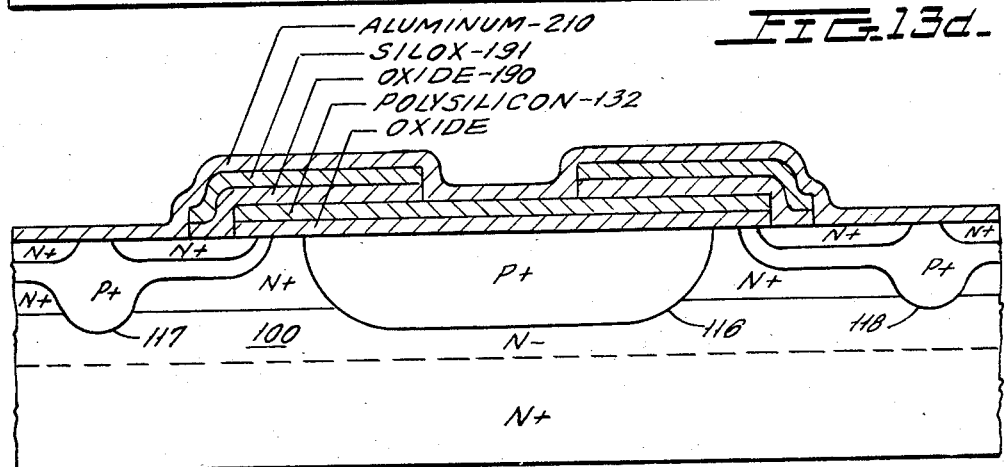

The effect of the mask of FIG. 21 on the extending gate fingers is shown in FIG. 13d, where the mask of FIG. 21 permits the formation of a slit in the photoresist pattern including sections 220 and 221 in FIG. 13d leaving a central gap over the silox coating 191. Thus, during the oxide etch which follows the forming of the photoresist pattern, the exposed silox 191 in FIG. 13d and then the oxide layer 190 therebeneath will be etched away to expose the underlying polysilicon layer 132. Thereafter, and as shown in FIG. 13e, the aluminum layer 210 is coated over the entire exposed surface of the contact fingers.

Figure 12C:
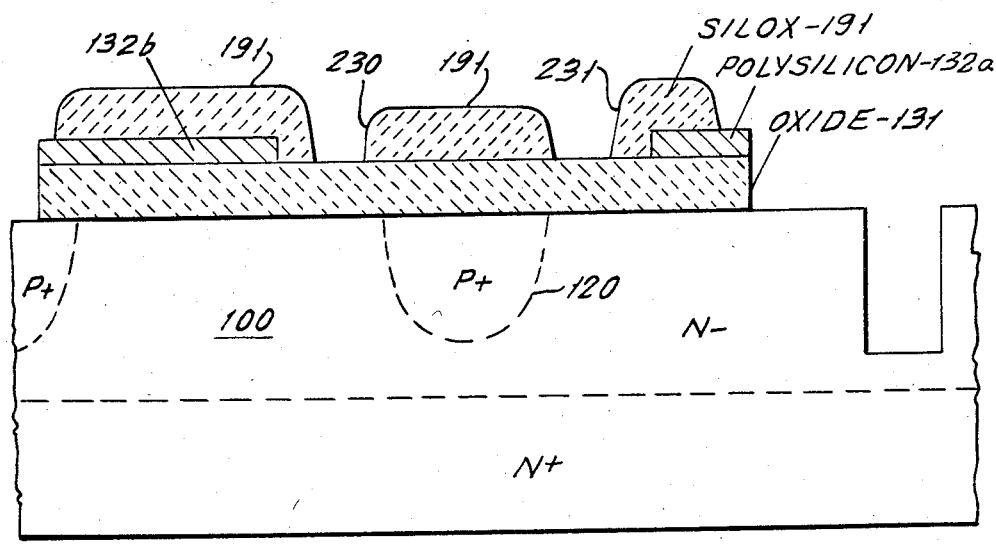

The effect of the mask of FIG. 21 on the outer peripheral pattern of the chip is shown in FIG. 12c. Thus, the mask of FIG. 21 masks the surrounding peripheral region in such a manner that the subsequent oxide etch will etch elongated windows 230 and 231 through the silox layer 191. This double cut prevents the polarizing of the reflowed silox glass 191.

Figure 12D:
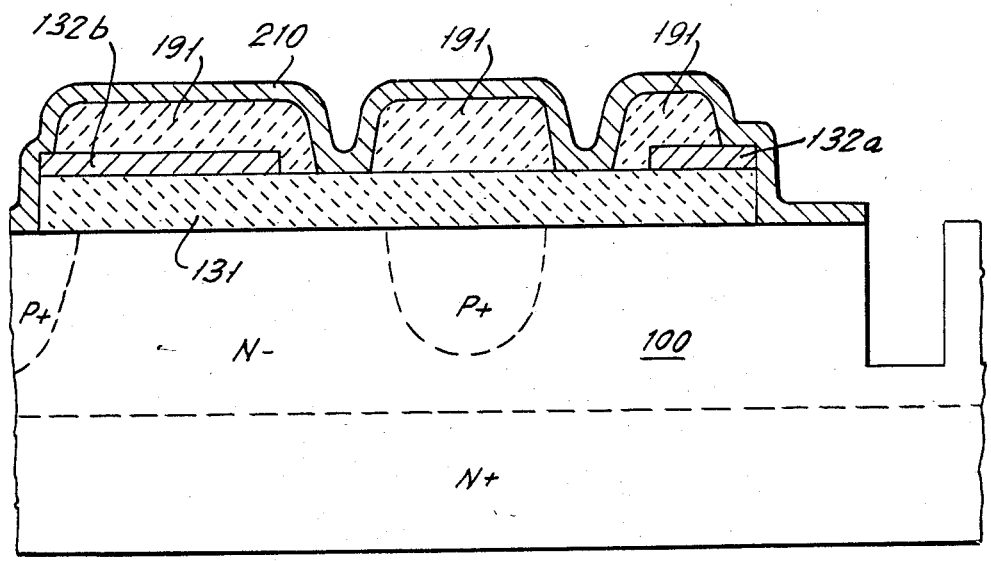

Thereafter, the aluminum coating 210 is laid down over the exposed gate finger region as shown in FIG. 12d.

Figure 13F:
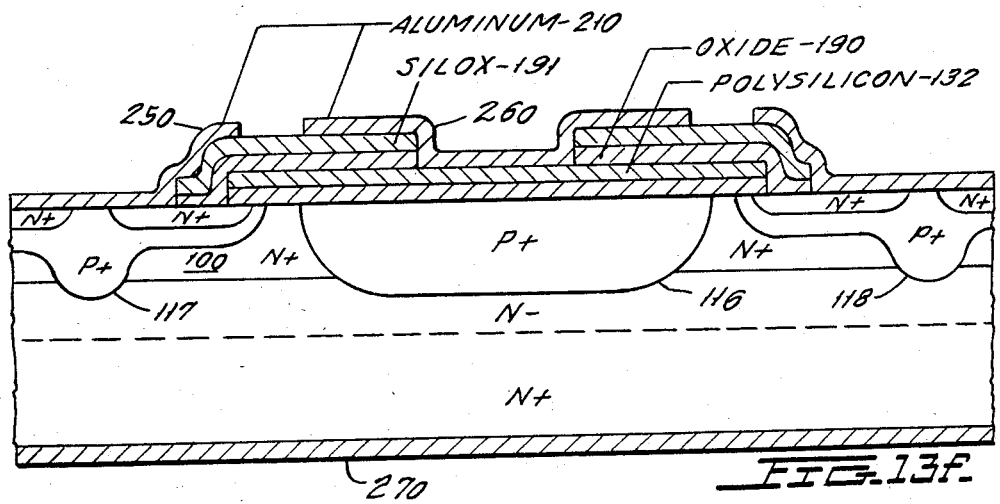

The next mask to be employed in the process is a mask which enables the laying of a photoresist mask to permit the etch of strips or windows 250 and 260 in each of the extending gate fingers as shown in FIG. 13f. Thus, an appropriate photoresist pattern is laid down and an aluminum etch is carried out using a suitable aluminum etch medium, thereby to isolate the central aluminum finger overlying only the P+ region 116. This aluminum finger serves as a gate contact which is connected to the polysilicon 132 which is, in turn, a continuous part of the polygonal mesh extending over the full surface of the chip. In this way, the gate fingers are electrically connected to a large number of individual hexagonal regions, thereby to make good electrical connection to the entire gate surface available for the chip.

Figure 12E:
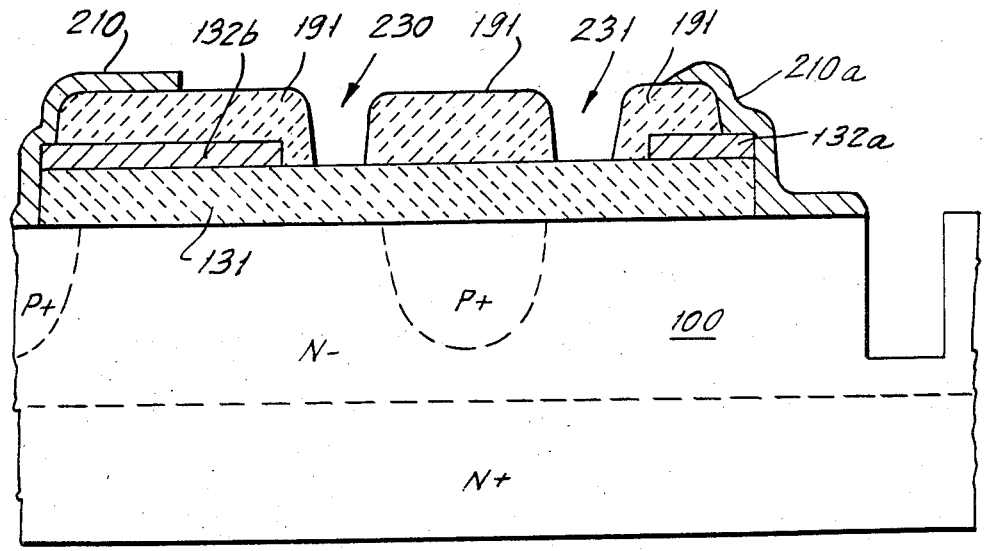

At the same time, the mask enables the further processing of the enclosing periphery of the chip by etching the aluminum layer in the regions 230 and 231 as shown in FIG. 12e. Note in FIG. 12e that the metallizing 210 has a severed annular region 210a which is electrically connected to polysilicon region 132a beneath it to act as a field stopper ring. Since region 210a is connected to the drain, the N− region below ring 210 and at the outer periphery of the chip cannot invert due to a charge on polysilicon region 132a. The outer periphery of metallizing 210 is connected to ring 132b as shown in FIG. 12e where ring 132 acts as a field plate.

Following the aluminum etch, the photoresist is stripped and silox is deposited over the entire exposed surface of the wafer and of all the chips within the wafer. This second silox layer 250 (FIG. 22) is for protective purposes and is not reflowed. The silox layer 250 has a lower phosphorus concentration than the first layer 191 and, for example, can be from 2% to 4% by weight.

Thereafter, a sixth mask is applied to the device which masks the entire surface except for the enlarged pad regions for connection to the gate and to the source (corresponding to regions 105 and 106 in FIG. 7). The wafer is then immersed in a silox etch which removes the silox from the pad regions and exposes the aluminum coating on the pads. The photoresist is then stripped from the wafer and the wafer is appropriately cleaned.

Thereafter, a back metal, consisting of layers of chromium, nickel and silver, is applied to the wafer, shown as back electrode 270 which serves as the drain connection region for the device.

All of the chips are then appropriately probed and broken out of the wafer along their scribe lines, as was described in connection with FIG. 1 and are cleaned. Suitable electrode wires are then connected to the source and gate pads and the device is mounted in a housing which may be connected to the drain electrode 270.

The invention has been described above in connection with a cellular type arrangement for the source cells as disclosed in copending application Ser. No. 38,662. Clearly, the invention is also applicable to interdigitated source configurations as disclosed in application Ser. No. 951,310.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. A high current MOSFET having low forward resistance comprising a semiconductor chip having first and second parallel surfaces; said chip having a body portion which is relatively lightly doped with impurities of a first conductivity type; said body portion extending from said first surface for at least a portion of the thickness of said chip; a plurality of local regions of a second conductivity type distributed over and extending into said first surface of said chip; a plurality of source regions of said first conductivity type extending into respective ones of said plurality of local regions and having a depth less than the depth of their said respective local region and an outer periphery which is interior of and spaced by a fixed distance from the periphery of said local region at said first surface, thereby to define short conduction channels capable of inversion; each of said plurality of local regions being spaced from one another at said first surface by a symmetric mesh of said body portion; a mesh-shaped gate insulation layer extending over said mesh between said local regions and overlapping said short conductive channels surrounding said local regions; a mesh-shaped gate electrode disposed atop said gate insulation layer; a vertical conductive region of said first conductivity type extending from beneath said gate insulation layer and between adjacent local regions and toward said second surface; a common source electrode connected to each of said source regions and to each of said local regions; said common source electrode extending over said first surface; and a drain electrode connected to said second surface; said vertical conductive region having a higher doping concentration than that of said body portion for a depth below said first surface which is less than the depth of said local regions; said doping concentration in said vertical conductive region having a constant value laterally across said first surface beneath said insulation layer.

2. The MOSFET of claim 1 wherein the doping concentration beneath said gate insulation layer decreases with depth below said first surface, and has a constant lateral concentration at any given depth.

3. The MOSFET of claim 1 wherein said gate insulation layer is an oxide and wherein said gate electrode atop said oxide is polysilicon.

4. The MOSFET of claim 1 wherein said vertical conductive region has a depth beneath said first surface of about one micron.

5. The MOSFET of claim 1 wherein said local regions and said source regions have corresponding peripheries which are polygonal.

6. The MOSFET of claim 1 wherein said local regions and said source regions have corresponding peripheries which are hexagonal.

7. The MOSFET of claim 1 wherein said local regions have a deep central region and a shallow outer periphery; said source regions overlying said shallow outer peripheries of their said respective local regions.

8. The MOSFET of claim 1 wherein said chip has a floating guard ring of said second conductivity type extending around the outer periphery of said first surface.

9. The MOSFET of claim 1 wherein at least one elongated gate contact is deposited on said mesh-shaped gate electrode for making contact to said mesh; said elongated gate contact being coplanar with said source electrode and electrically insulated therefrom.

10. A high power MOSFET device having a large number of parallel-connected individual FET devices closely packed into a relatively small area comprising:

a thin wafer of monocrystalline semiconductor material having first and second spaced, parallel surfaces; at least a first portion of the thickness of said wafer which extends from said first surface having a resistivity of a value characterized by an epitaxially deposited N− or P− region and being of one of the N or P conductivity types;

a plurality of symmetrically disposed, laterally distributed hexagonal regions, each extending into said first portion of said wafer for given depths and extending to said first surface; said hexagonal regions spaced from one another by a symmetric hexagonal lattice of the material of said first portion;

each side of each of said hexagonal regions being parallel to and adjacent the side of another of said hexagonal regions;

a respective hexagonal annular source region of the other of the conductivity types formed in the outer peripheral regions of said each of said hexagonal regions and extending downward from said first surface;

the outer rim of each of said annular source regions being annularly spaced from the outer periphery of its said respective hexagonal region to form an annular channel between each said annular source region and the adjacent said hexagonal lattice of the material of said first portion of said wafer which is diposed between said hexagonal regions;

a single common source electrode formed in said first surface and connected to each of said source regions and to the center of each of said hexagonal regions at said first surface;

a single drain electrode connected to said second surface of said wafer;

an insulation layer means on said first surface and overlying said hexagonal lattice of material disposed between said hexagonal regions and said annular channels; and a gate electrode atop said insulation layer means and operable to control the formation of an inversion layer in said annular channels; said hexagonal lattice having an increased doping concentration at said first surface; said doping concentration having a constant value laterally across said hexagonal lattice at said first surface.

11. The MOSFET device of claim 10 wherein said doping concentration in said hexagonal lattice decreases with depth below said first surface, and has a constant lateral concentration at any given depth.

12. The MOSFET device of claim 10 or 11 wherein said gate electrode is of polysilicon material.

13. The MOSFET device of claim 10 or 11 which includes more than 1,000 individual parallel-connected FET devices formed in said wafer, which have a width less than about 1 mil.

14. The MOSFET device of claim 10 or 11 wherein the portions of said hexagonal lattice which extends from said first surface for a depth less than the depth of said hexagonal regions has a relatively high conductivity compared to the conductivity of said first portion of said wafer.

* * * * *

REEXAMINATION CERTIFICATE (3434th)

United States Patent [19]
Lidow et al.

[11] B1 4,593,302
[45] Certificate Issued Feb. 3, 1998

[54] PROCESS FOR MANUFACTURE OF HIGH POWER MOSFET LATERALLY DISTRIBUTED HIGH CARRIER DENSITY BENEATH THE GATE OXIDE

[75] Inventors: Alexander Lidow, Manhattan Beach; Thomas Herman, Redondo Beach, both of Calif.

[73] Assignee: International Rectifier Corporation, Los Angeles, Calif.

Reexamination Request:
No. 90/003,773, Apr. 3, 1995

Reexamination Certificate for:
Patent No.: 4,593,302
Issued: Jun. 3, 1986
Appl. No.: 178,689
Filed: Aug. 18, 1980

[51] Int. Cl.[6] ............................................. H01L 29/76
[52] U.S. Cl. ................... 257/342; 257/339; 257/341
[58] Field of Search .................................. 257/592, 623, 257/629

[56] References Cited

U.S. PATENT DOCUMENTS

| | | | |
|---|---|---|---|
| 3,627,598 | 12/1971 | McDonald et al. | 257/623 |
| 3,915,767 | 10/1975 | Welliver | 257/592 |
| 4,029,527 | 6/1977 | Glasl et al. | 257/607 |
| 4,145,700 | 3/1979 | Jambotkar | 357/23 |
| 4,206,469 | 6/1980 | Hanes et al. | 257/341 |
| 4,216,030 | 8/1980 | Graul et al. | 257/617 |
| 4,263,067 | 4/1981 | Takahashi et al. | 257/593 |
| 4,376,286 | 3/1983 | Lidow et al. | 357/23 |
| 5,008,725 | 4/1991 | Lidow et al. | 357/23.4 |

FOREIGN PATENT DOCUMENTS

| | | |
|---|---|---|
| 0022001 | 1/1981 | European Pat. Off. . |
| 52-106688 | 9/1977 | Japan . |
| 53-135284 | 11/1978 | Japan . |
| 54-885 | 1/1979 | Japan . |
| 55-53462 | 4/1980 | Japan . |
| 1556276 | 11/1979 | United Kingdom . |
| 2031226 | 4/1980 | United Kingdom . |
| 2033658 | 5/1980 | United Kingdom . |
| 2062349 | 5/1981 | United Kingdom . |

OTHER PUBLICATIONS

S. M. Sze, *Semiconductor Devices, Physics and Technology*, John Wiley & Sons, New York (1985) pp. 394–398.

Full English Translation of Japan Kokai 51–134076 as per Ralph McElroy Company.

Collins et al., "Hexfet, a New Power Technology, Cuts On–Resistance, Boosts Ratings," Electronic Design, Jun. 7, 1979, pp. 36–40.

*Primary Examiner*—J. Carroll

[57] ABSTRACT

A high power MOSFET structure consists of a plurality of source cells distributed over the upper surface of a semiconductor chip, with a drain electrode on the bottom of the chip. Each of the source cells is hexagonal in configuration and is surrounded by a narrow, hexagonal conduction region disposed beneath a gate oxide. The semiconductor material beneath the gate oxide has a relatively high conductivity, with the carriers being laterally equally distributed in density beneath the gate oxide. The high conductivity hexagonal channel is formed in a low conductivity epitaxially formed region and consists of carriers deposited on the epitaxial region prior to the formation of the source region. Symmetrically arranged gate fingers extend over the upper surface of the device and extend through and along slits in the upper source metallizing and are connected to a polysilicon gate grid which overlies the gate oxide.

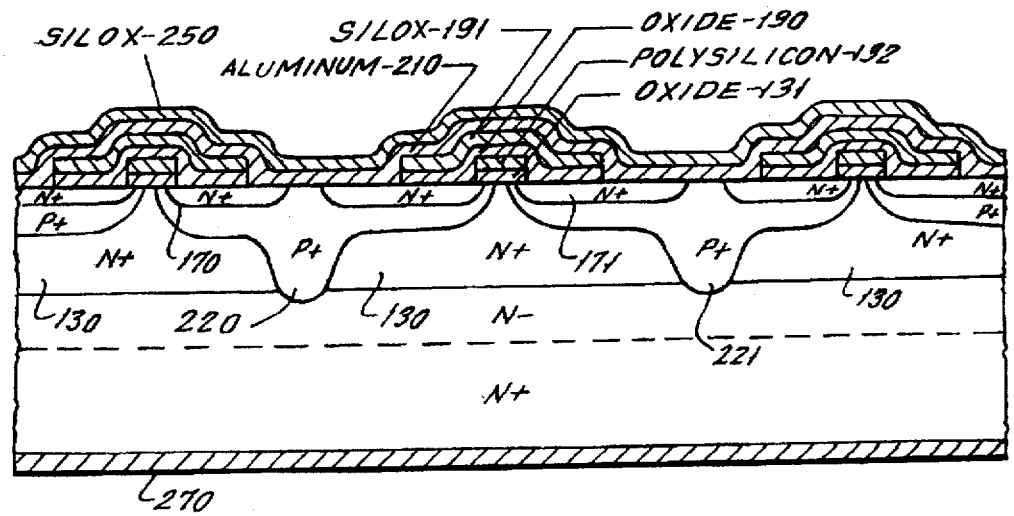

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–3 and 5–14 is confirmed.

Claim 4 is determined to be patentable as amended.

New claims 15 and 16 are added and determined to be patentable.

4. The MOSFET of claim 1 wherein said vertical conductive region has a depth beneath said first surface of about one micron *and which is greater than the depth of said source regions.*

*15. The MOSFET of claim 1 wherein said vertical conductive region is doped with phosphorus atoms.*

*16. The MOSFET device of claim 10 wherein said hexagonal lattice is doped with phosphorus atoms.*

* * * * *